(12) United States Patent  
Eckberg et al.

(10) Patent No.: US 7,267,550 B1  
(45) Date of Patent: Sep. 11, 2007

(54) PRINTED CIRCUIT BOARD CAPABLE OF RECEIVING AN ON-BOARD BATTERY FROM MULTIPLE ORIENTATIONS

(75) Inventors: Eric A. Eckberg, Rochester, MN (US); Michael S. Good, Fountain, MN (US); Ray C. Laning, Kasson, MN (US); Mark D. Pfeifer, Rochester, MN (US); Scott A. Shurson, Mantorville, MN (US); Matthew C. Zehrer, St. Paul, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/605,883

(22) Filed: Nov. 29, 2006

(51) Int. Cl.  
*H01R 12/00* (2006.01)

(52) U.S. Cl. ........................................... 439/65
(58) Field of Classification Search .................. 439/65
See application file for complete search history.

(56) References Cited

U.S. PATENT DOCUMENTS 7,044,801 B2 * 5/2006 Park ........................... 439/638
2007/0072444 A1 * 3/2007 Okuyama et al. ............. 439/65

* cited by examiner

*Primary Examiner*—Tho D. Ta
(74) *Attorney, Agent, or Firm*—Dillon & Yudell

(57) ABSTRACT

A printed circuit board capable of receiving an on-board battery from multiple orientations is disclosed. The movement of the on-board battery on the printed circuit board is directed via one or more guide tabs on the on-board battery that fit within one or more guide rails attached to the printed circuit board. A cam lever is attached to the on-board battery and enables a user to utilize mechanical advantage to install and/or remove the on-board battery on the printed circuit board. A pull tab attached to the on-board battery provides additional surface area to distribute the force when a user removes the on-board battery. The on-board battery can be installed and/or removed orthogonally and/or horizontally to the printed circuit board during the operation of the printed circuit board.

9 Claims, 4 Drawing Sheets

PRINTED CIRCUIT BOARD CAPABLE OF RECEIVING AN ON-BOARD BATTERY FROM MULTIPLE ORIENTATIONS

BACKGROUND OF THE INVENTION

1. Technical Field

The present invention relates to printed circuit boards in general, and more particularly, to printed circuit boards having on-board batteries. Still more particularly, the present invention relates to a printed circuit board capable of receiving an on-board battery from multiple orientations.

2. Description of Related Art

Computer systems typically include multiple printed circuit boards, each of which provides different functions for the computer system. Depending on the size of a printed circuit board and the space available within the chassis of a computer system, some printed circuit boards are designed to be installed in the computer system vertically while other printed circuit boards are designed to be installed in the computer system horizontally.

Absent any specific design requirements, it is generally preferable to have various printed circuit boards to be situated as close to each other as possible within a computer system for compactness. However, some printed circuit boards include on-board batteries for providing additional power and/or serving as independent power sources, and replacing on-board batteries can be very difficult in tight spaces. Auto-docking connectors may reduce on-board battery replacement times, but they tend to require relatively high physical connection/disconnection force. Other simple and cost-effective solutions, such as providing a pull tab for an on-board battery, may increase the leverage utilized by extraction forces but they do not provide any mechanical advantage during battery installation.

Since quick and easy replacements of on-board batteries are paramount for computer systems that require high user-availability, such as computer servers, it would be desirable to provide an improved printed circuit board with such a feature.

SUMMARY OF THE INVENTION

In accordance with a preferred embodiment of the present invention, a printed circuit board includes a first and second sets of connectors. The first set of connectors is designed to couple to a slot on a motherboard in a first orientation. The second set of connectors is designed to couple to a slot on a motherboard in a second orientation that is orthogonal to the first orientation. The printed circuit board also includes a receiving means for receiving an on-board battery. The receiving means allows the on-battery to be removed from the printed circuit board when the printed circuit board is mounted on a motherboard either in the first orientation or in the second orientation.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
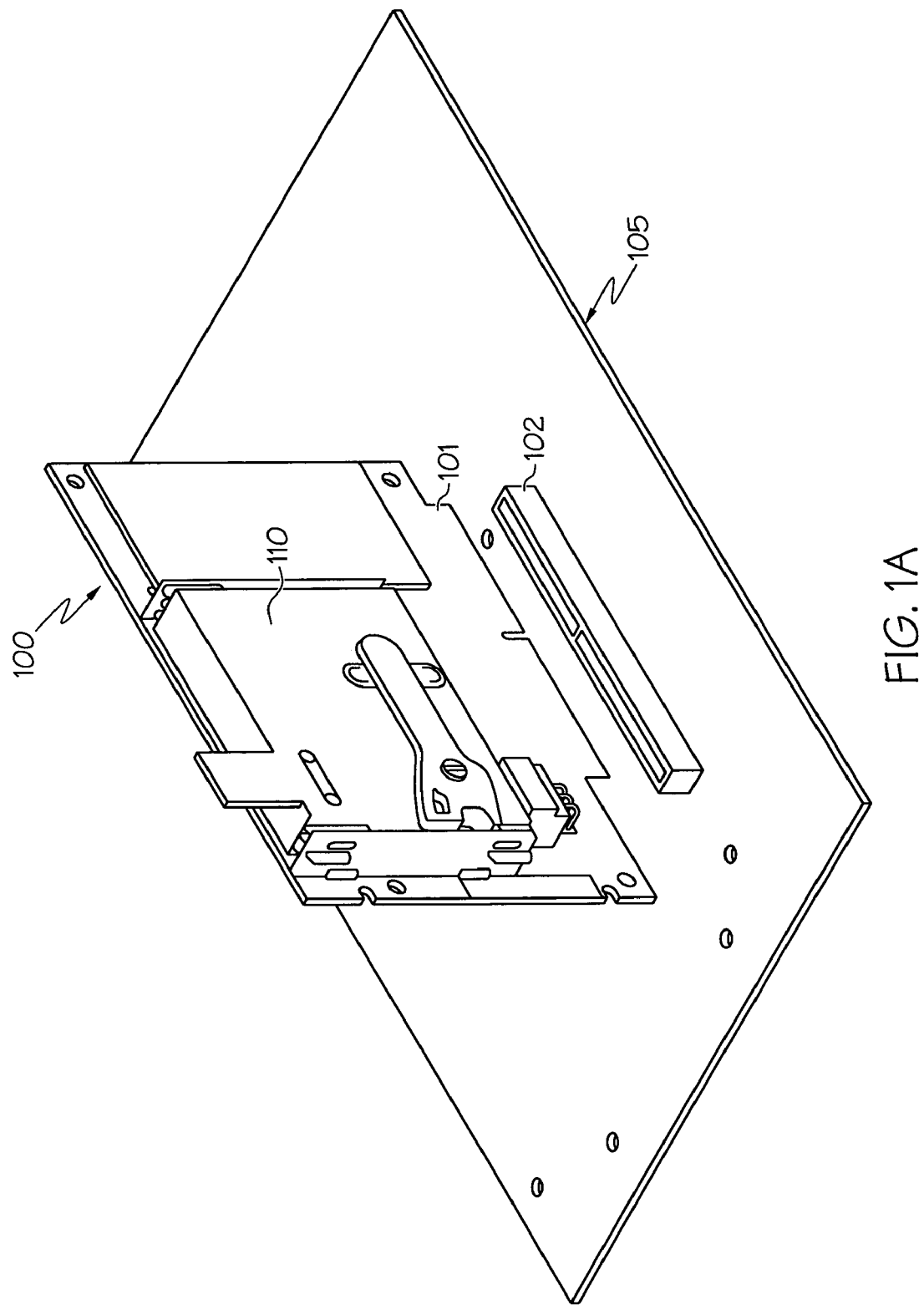
FIGS. 1a and 1b are isometric views of a printed circuit board in accordance with a preferred embodiment of the present invention.
Figure 1B:
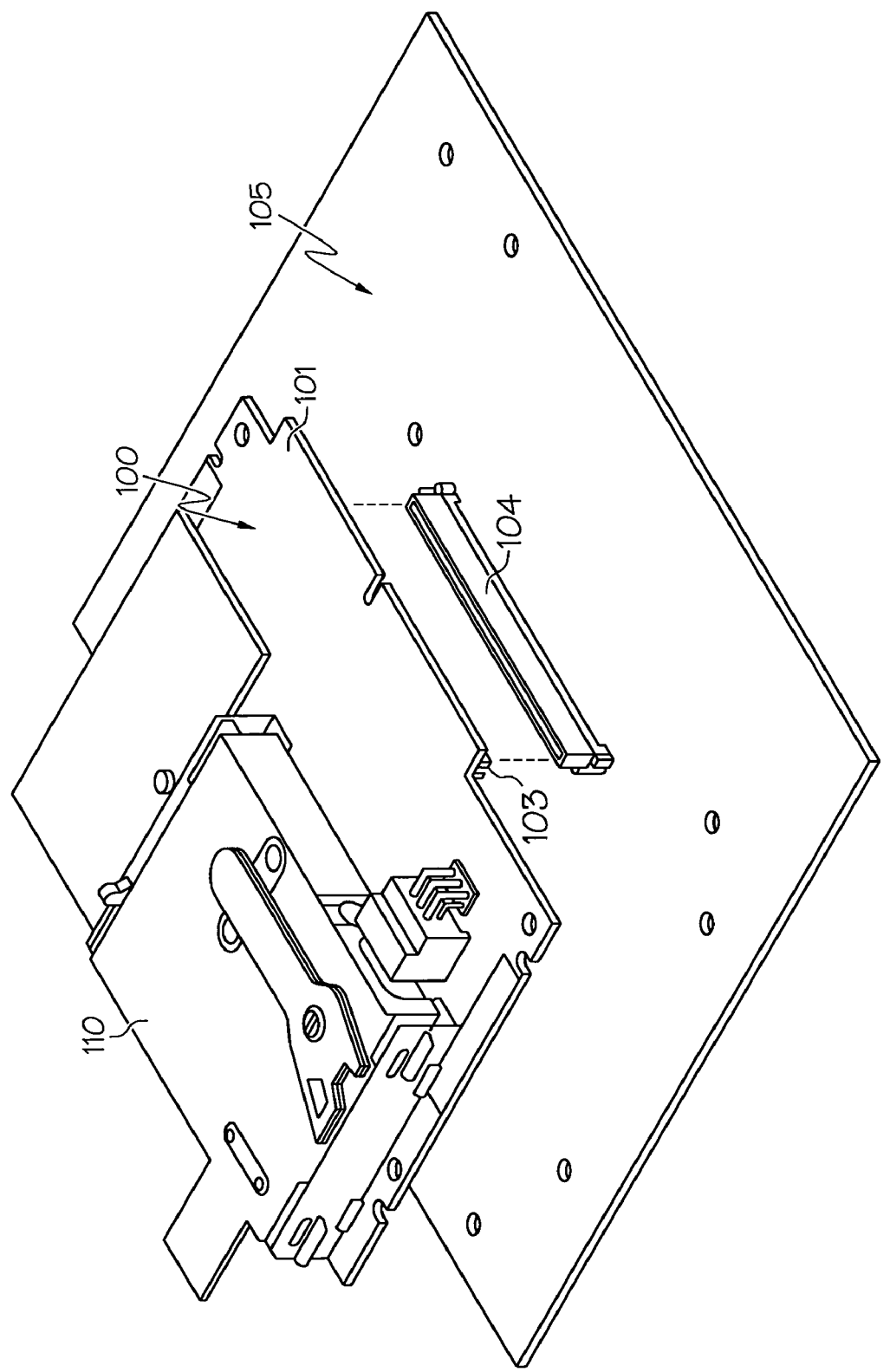

Referring now to the drawings, and specifically to FIGS. 1a and 1b, there are illustrated isometric views of a printed circuit board in accordance with a preferred embodiment of the present invention. In FIG. 1a, a printed circuit board 100 is shown to be capable of being vertically or orthogonally mounted onto a motherboard 105 by inserting connectors 101 into an adaptor slot 102. Motherboard 105 can be part of a computer system. Printed circuit board 100 includes an on-board battery 110 for providing additional power to printed circuit board 100 and/or serving as an independent power source for printed circuit board 100. Vertically mounted printed circuit board 100 occupies a minimum amount of horizontal space in the plane of motherboard 105, as such, motherboard 105 may receive a larger number of additional printed circuit boards.

In FIG. 1b, printed circuit board 100 having on-board battery 110 is shown to be capable of being horizontally mounted onto motherboard 105 by inserting connectors 103 into an adaptor slot 104. In other words, printed circuit board 100 can be mounted with a parallel orientation with respect to motherboard 105 within a computer system. Connectors 103 are orthogonally located from connectors 101. Horizontally mounted printed circuit board 100 occupies a minimum amount of vertical space in the plane of motherboard 105, thereby enabling motherboard 105 to maintain a low profile for applications when motherboard 105 is mounted in a computer system with limited internal dimensions.

Figure 2:
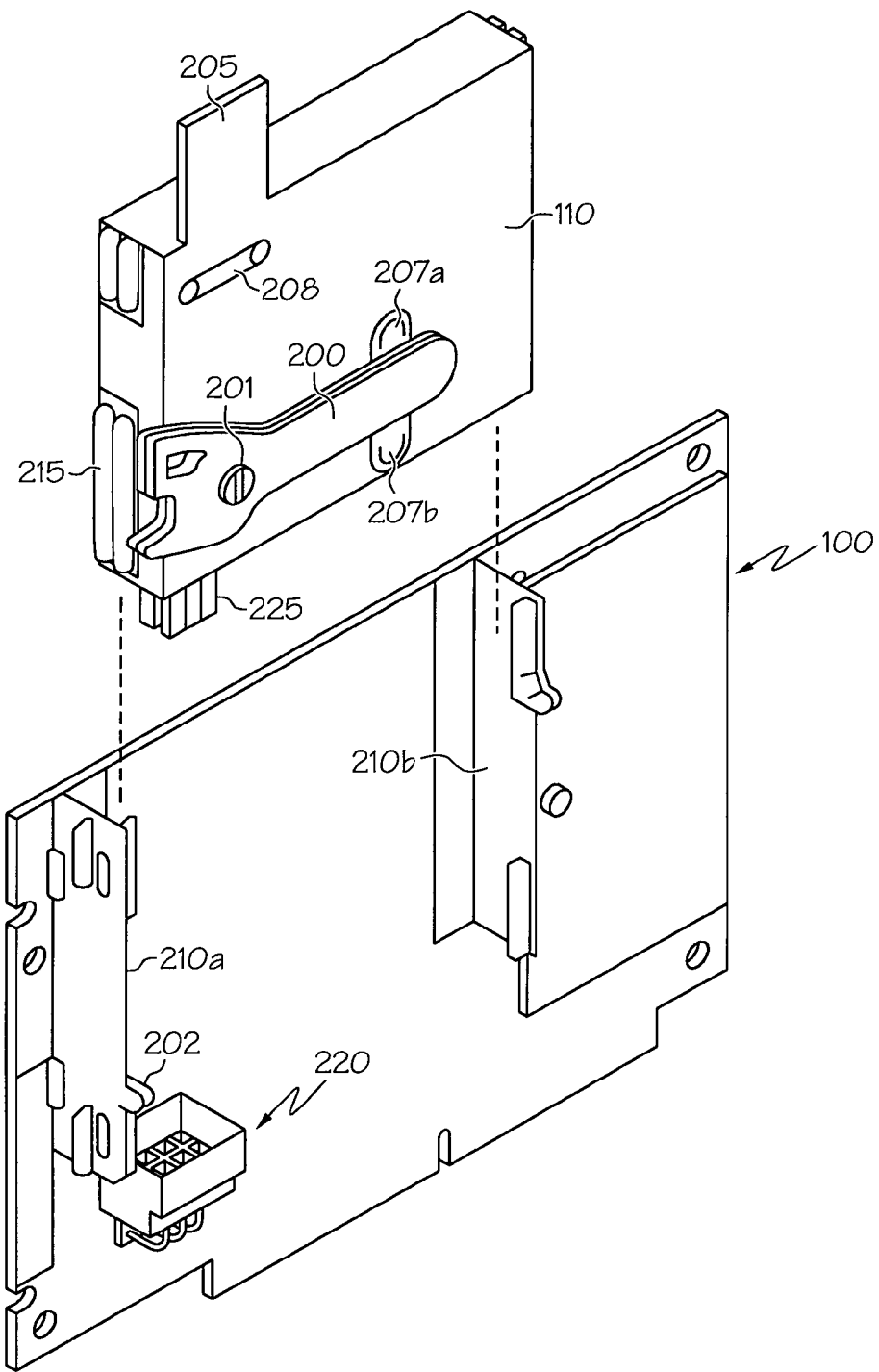
FIG. 2 is a diagram of an on-board battery being inserted to the printed circuit board of FIG. 1 from a vertical position, in accordance with a preferred embodiment of the present invention.

With reference now to FIG. 2, there is depicted a diagram of on-board battery 110 being inserted to printed circuit board 100 from a vertical position, in accordance with a preferred embodiment of the present invention. The configuration of FIG. 2 is designed for facilitating the insertions and removals of on-board battery 110 to and from printed circuit board 100 when printed circuit board 100 is mounted onto a motherboard in a vertical orientation depicted in FIG. 1a. As shown, on-board battery 110 includes a cam lever 200, a pull tab 205, one or more guide tabs 215, and a battery connector 225. Printed circuit board 100 includes guide rails 210a-210b and an auto-docking connector 220. Cam lever 200 is attached to on-board battery 110 via a pivot pin 201 and cam lever 200 can rotate within the plane of printed circuit board 100. When on-board battery 110 needs to be disengaged from printed circuit board 100, cam lever 200 interacts with a stop 202 located on guide rail 210a to produce a mechanical advantage to enable a user to overcome the mechanical force between battery connector 225 and auto-docking connector 220. Pull tab 205 is securely connected to the surface and/or packaging of on-board battery 110 and distributes the removal force across a wide area to ensure efficient and reliable removal of on-board battery 110 from printed circuit board 100. Cam lever 200 and pull tab 205 are preferably painted with identical vivid color in order to indicate that cam lever 200 and pull tab 205 can be utilized together to remove or install on-board battery 110 during system operation (i.e., on-board battery 110 is a "hot-pluggable" component).

Guide tabs 215 are located on opposite sides of on-board battery 110. During the insertion of on-board battery 110 into printed circuit board 100, a user slides battery 110 parallel to the plane of printed circuit board 100, such that guide tabs 215 fit within guide rails 210a-210b. The user can then applies a force to rotate cam lever 200, which interacts with stop 202 on guide rail 210a to produce a mechanical advantage and enable battery connector 225 to be coupled to auto-docking connector 220. On-board battery 110 includes tabs 207a-207b that enable cam lever 200 to be held in place during shipment and operation. On-board battery 110 also includes smaller tabs 208 that enable cam lever 200 to be temporarily held in place during the docking process until cam lever 200 initially makes contact with stop 202 on guide rail 210a and consequently begins to rotate as on-board battery 110 slides along guide rails 210a-210b during insertion.

Figure 3:
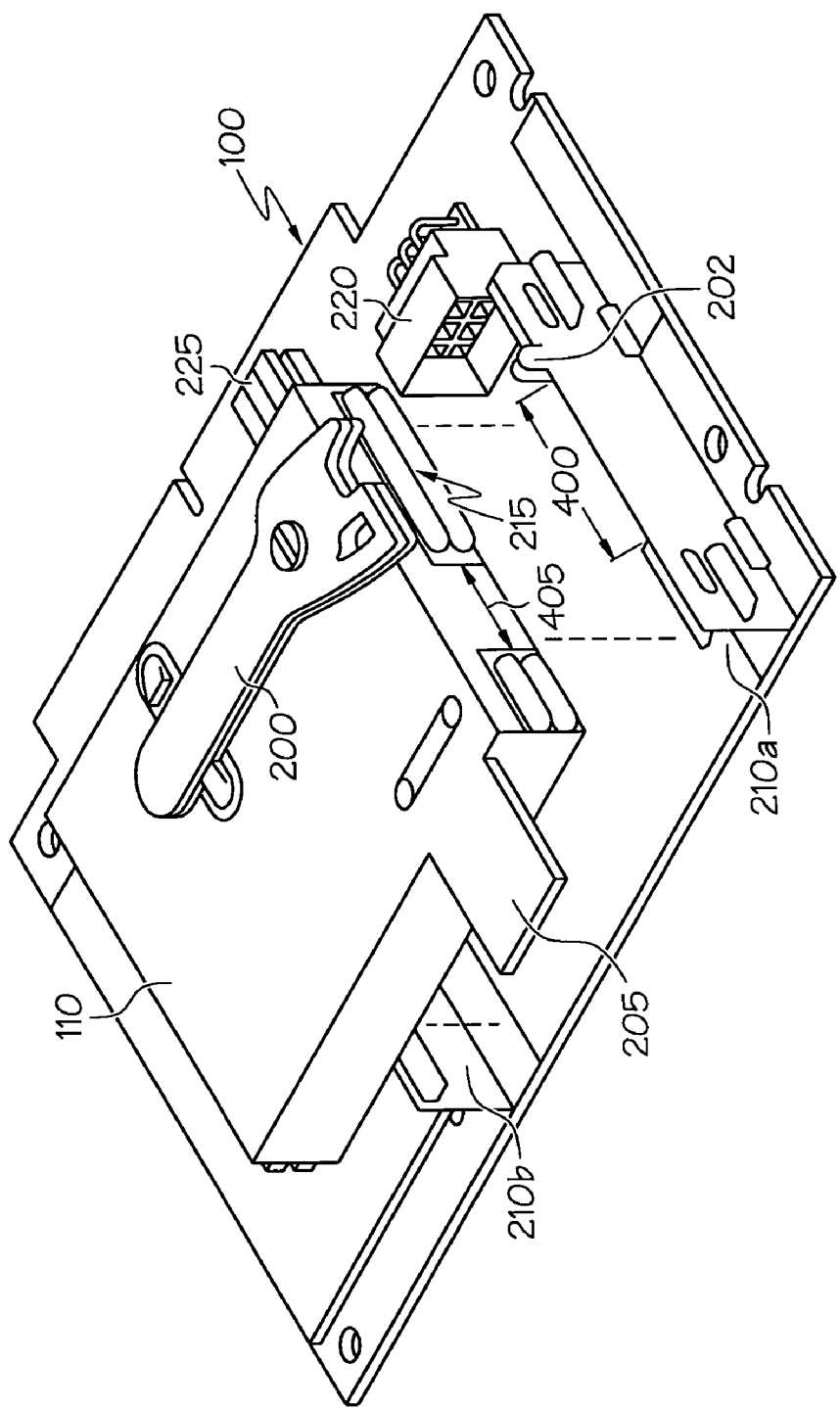
FIG. 3 is a diagram of an on-board battery being inserted to the printed circuit board of FIG. 1 from a horizontal position, in accordance with a preferred embodiment of the present invention.

Referring now to FIG. 3, there is depicted a diagram of on-board battery 110 being inserted to printed circuit board 100 from a horizontal position, in accordance with a preferred embodiment of the present invention. The configuration of FIG. 3 is designed for facilitating the insertions and removals of on-board battery 110 to and from printed circuit board 100 when printed circuit board 100 is mounted onto a motherboard in the horizontal orientation depicted in FIG. 1b. As shown, each of guide rails 210a-210b on printed circuit board 100 include an opening 400 for receiving guide tabs 215 located at on-board battery 110. Guide tabs 215 fit within openings 400 of guide rails 210a-210b, and on-board battery 110 can be "dropped" into guide rails 210a-210b. Once on-board battery 110 has been dropped between guide rails 210a-210b, a user can slides on-board battery 110 parallel to printed circuit board 100 towards auto-docking connector 220 until cam lever 200 makes contact with stop 202 on guide rail 210a and begins to rotate as on-board battery 110 slides along guide rails 210a-210b. The user can then applies a force to rotate cam lever 200, which interacts with stop 202 on guide rail 210a to produce a mechanical force that enables battery connector 225 to be coupled to auto-docking connector 220.

When on-board battery 110 needs to be disengaged from printed circuit board 100, cam lever 200 interacts with stop 202 on guide rail 210a to produce a mechanical advantage, thereby enabling a user to overcome the mechanical force between battery connector 225 and auto-docking connector 220. The user can then apply a force to rotate cam lever 200, which interacts with stop 202 on guide rail 210a and causes on-board battery 110 to slide along guide rails 210a-210b until guide tabs 215 align with openings 400 and a gap 405 aligns with the additional portion of the top of guide rails 210a-210b. At this point, the user can lift battery 110 away from printed circuit board 100 with guide tabs 215 passing through openings 400.

As has been described, the present invention provides a printed circuit board capable of receiving an on-board battery from multiple orientations. The present invention enables an on-board battery to be inserted to and removed from a printed circuit board in a horizontal or vertical orientation. Since the on-board battery is hot pluggable and can be removed efficiently from multiple orientations, the printed circuit board can be mounted in many different types of computer systems.

While the invention has been particularly shown and described with reference to a preferred embodiment, it will be understood by those skilled in the art that various changes in form and detail may be made therein without departing from the spirit and scope of the invention.

What is claimed is:

1. A printed circuit board comprising:
   a first set of connectors configured for coupling to a slot on a motherboard in a first orientation;
   a second set of connectors configured for coupling to a slot on a motherboard in a second orientation that is orthogonal to said first orientation; and
   a receiving means for receiving an on-board battery, wherein said on-board battery includes a cam lever and a pull tab, wherein said receiving means allows said on-board battery to be removed from said printed circuit board when said printed circuit board is mounted on a motherboard either in said first orientation or in said second orientation.

2. The printed circuit board of claim 1, wherein said receiving means is a pair of guide rails.

3. The printed circuit board of claim 1, wherein one of said pair of guide rails includes a stop for preventing said cam level on said on-board battery from sliding forward.

4. The printed circuit board of claim 1, wherein said on-board battery includes a battery connector.

5. The printed circuit board of claim 4, wherein said printed circuit board includes an auto-docking connector for connecting to said battery connector.

6. The printed circuit board of claim 1, wherein said on-board battery includes a plurality of guide tabs.

7. The printed circuit board of claim 6, wherein each of said pair of guide rails includes an opening for receiving said guide tabs.

8. A printed circuit board comprising:
   a first set of connectors configured for coupling to a slot on a motherboard in a first orientation;
   a second set of connectors configured for coupling to a slot on a motherboard in a second orientation that is orthogonal to said first orientation; and
   a receiving means for receiving an on-board battery wherein said on-board battery includes a cam lever and a pull tab, wherein said cam lever and said pull tab are of identical color, wherein said receiving means allows said on-battery to be removed from said printed circuit board when said printed circuit board is mounted on a motherboard either in said first orientation or in said second orientation.

9. A printed circuit board comprising:
   a first set of connectors configured for coupling to a slot on a motherboard in a first orientation;
   a second set of connectors configured for coupling to a slot on a motherboard in a second orientation that is orthogonal to said first orientation; and
   a receiving means for receiving an on-board battery wherein said on-board battery includes a cam lever and a pull tab, wherein said on-board battery includes a plurality of tabs that enable said cam lever to be held in place during shipment and operation, wherein said receiving means allows said on-battery to be removed from said printed circuit board when said printed circuit board is mounted on a motherboard either in said first orientation or in said second orientation.

* * * * *